United States Patent
Bell et al.

(10) Patent No.: US 11,143,715 B2
(45) Date of Patent: Oct. 12, 2021

(54) BROKEN CONDUCTOR DETECTION IN A MULTIPLE-PHASE ELECTRIC POWER DELIVERY SYSTEM

(71) Applicant: Schweitzer Engineering Laboratories, Inc., Pullman, WA (US)

(72) Inventors: Jordan Bell, Pullman, WA (US); Kanchanrao Gangadhar Dase, Pullman, WA (US); Sajal Harmukh, Pullman, WA (US); Normann Fischer, Colfax, WA (US); Daqing Hou, Des Moines, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/993,496

(22) Filed: Aug. 14, 2020

(65) Prior Publication Data
US 2021/0048486 A1     Feb. 18, 2021

Related U.S. Application Data

(60) Provisional application No. 62/887,329, filed on Aug. 15, 2019.

(51) Int. Cl.
*G01R 31/54* (2020.01)
*G01R 31/08* (2020.01)

(52) U.S. Cl.
CPC ............ *G01R 31/54* (2020.01); *G01R 31/085* (2013.01)

(58) Field of Classification Search
CPC ........ G01R 31/52; G01R 31/50; G01R 31/54; G01R 31/55; G01R 31/56; G01R 31/085
See application file for complete search history.

(56) References Cited

U.S. PATENT DOCUMENTS 4,297,740 A    10/1981  Hagberg
4,347,542 A *   8/1982  Calhoun ............... H02H 3/343
                                               361/76
(Continued)

FOREIGN PATENT DOCUMENTS

CN        1601848 A  *  3/2005  ............ H02H 3/307
CN      101699301 A  *  4/2010
(Continued)

OTHER PUBLICATIONS

William O'Brien, et al. "Catching Falling Conductors in Midair—Detecting and Tripping Broken Distribution Circuit Conductors at Protection Speeds" Presented at the 42nd Annual Western Protective Relay Conference, Oct. 2015.
(Continued)

*Primary Examiner* — Patrick Assouad
*Assistant Examiner* — Demetrius R Pretlow
(74) *Attorney, Agent, or Firm* — Richard M. Edge (57) ABSTRACT

Disclosed herein are systems for determining a broken conductor condition in a multiple-phase electric power delivery system. It has been observed that broken conductors pose a safety concern when occurring in the presence of people or vulnerable environmental conditions. Broken conductor conditions disclosed herein may be used to detect and trip the phase with the broken conductor, thus reducing or even eliminating the safety risk. Further, a distance to the opening may be determined.

20 Claims, 9 Drawing Sheets

(56) References Cited

U.S. PATENT DOCUMENTS

| | | | |
|---|---|---|---|
| 4,357,644 A * | 11/1982 | Schmidt | H02H 3/343 361/76 |
| 4,600,961 A | 7/1986 | Bishop | |
| 5,883,578 A | 3/1999 | Roberts | |
| 6,453,248 B1 * | 9/2002 | Hart | G01R 31/088 702/58 |
| 6,573,726 B1 | 6/2003 | Roberts | |
| 6,833,711 B1 | 12/2004 | Hou | |
| 7,720,619 B2 | 5/2010 | Hou | |
| 7,945,400 B2 | 5/2011 | Hou | |
| 8,289,668 B2 | 10/2012 | Kasztenny | |
| 8,321,162 B2 * | 11/2012 | Labuschagne | H02J 3/46 702/60 |
| 8,581,723 B2 | 11/2013 | Schweitzer | |
| 8,942,954 B2 * | 1/2015 | Gong | G01R 31/085 702/185 |
| 9,160,158 B2 | 10/2015 | Schweitzer | |
| 9,413,156 B2 | 8/2016 | O'Brien | |
| 9,509,399 B2 | 11/2016 | Kasztenny | |
| 9,568,516 B2 | 2/2017 | Gubba Ravikumar | |
| 10,340,684 B2 | 7/2019 | Sridharan | |
| 10,823,777 B2 | 11/2020 | Dase | |
| 2005/0057212 A1 | 3/2005 | Harbaugh | |
| 2005/0231871 A1 * | 10/2005 | Ghartemani | G01R 19/2513 361/86 |
| 2007/0055889 A1 | 3/2007 | Henneberry | |
| 2008/0031520 A1 * | 2/2008 | Hou | H02H 1/0015 382/168 |
| 2008/0211511 A1 | 9/2008 | Choi | |
| 2011/0075304 A1 | 3/2011 | Hamer | |
| 2012/0063040 A1 * | 3/2012 | Rostron | H02H 3/32 361/49 |
| 2012/0068717 A1 * | 3/2012 | Gong | G01R 31/085 324/522 |
| 2012/0161684 A1 * | 6/2012 | Tiwari | H02P 23/14 318/490 |
| 2012/0330582 A1 | 12/2012 | Wiszniewski | |
| 2013/0107405 A1 | 5/2013 | Blumschein | |
| 2013/0221976 A1 * | 8/2013 | Blumschein | G01R 31/088 324/509 |
| 2014/0028116 A1 | 1/2014 | O'Brien | |
| 2015/0124358 A1 | 5/2015 | Hulse | |
| 2016/0041216 A1 | 2/2016 | Tang | |
| 2016/0091537 A1 | 3/2016 | Gaarder | |
| 2016/0266193 A1 | 9/2016 | Ennis | |
| 2016/0299187 A1 | 10/2016 | Liang | |
| 2016/0308349 A1 * | 10/2016 | Sridharan | G01R 31/52 |
| 2017/0315168 A1 * | 11/2017 | Benmouyal | G01R 31/085 |
| 2018/0284180 A1 | 10/2018 | Ha | |
| 2019/0317143 A1 | 10/2019 | Dase | |

FOREIGN PATENT DOCUMENTS

| | | | | |
|---|---|---|---|---|
| CN | 102608491 A | * | 7/2012 | H02P 29/0241 |
| CN | 102694375 A | * | 9/2012 | H02H 3/307 |
| CN | 102696161 A | * | 9/2012 | H02H 3/307 |
| CN | 103308823 A | * | 9/2013 | H02H 3/307 |
| CN | 104730410 A | * | 6/2015 | |
| CN | 204462305 U | * | 7/2015 | |
| CN | 105738751 A | * | 7/2016 | |
| CN | 106908692 A | * | 6/2017 | |
| CN | 105207176 B | * | 7/2017 | H02P 29/0241 |
| CN | 109324269 A | * | 2/2019 | H02H 3/307 |
| CN | 109975661 A | * | 7/2019 | |
| WO | WO-2007086944 A2 | * | 8/2007 | H02H 3/307 |
| WO | 2014/018909 | | 1/2014 | |
| WO | WO-2019229638 A1 | * | 12/2019 | G01R 31/08 |

OTHER PUBLICATIONS

Kanchanrao Dase and Normann Fischer, "Computationally Efficient Methods for Improved Double-Ended Transmission Line Fault Locating" Originally Presented at the 45th Annual Western Protective Relay Conference, Oct. 2018.

* cited by examiner

BROKEN CONDUCTOR DETECTION IN A MULTIPLE-PHASE ELECTRIC POWER DELIVERY SYSTEM

RELATED APPLICATION

The present disclosure claims benefit under 35 U.S.C. § 119(e) of U.S. Provisional Patent Application No. 62/887,329, filed on 15 Aug. 2019, and entitled "Broken Conductor Detection in a Multiple-Phase Electric Power Delivery System" which is herein incorporated by reference in its entirety and for all purposes.

TECHNICAL FIELD

This disclosure relates to broken conductor detection in multiple-phase electric power delivery system. More particularly, this disclosure relates to detecting a broken conductor and determining which phase is open. Additionally, this disclosure teaches calculation of a distance to the location of the broken conductor in various instances.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric power delivery systems are widely used to generate, transmit, and distribute electric power to loads, and serve as an important part of the critical infrastructure. Power systems and components are often monitored and protected by intelligent electronic devices (IEDs) and systems of IEDs that obtain electric power system information from the equipment and provide protective actions, monitor, and automate the power system.

Electric power delivery systems periodically experience faults such as when a conductor breaks and creates an electrical path to ground or another phase conductor. For the safety of people and objects in the vicinity of a fault and to protect electric power system equipment from damage that may occur during a fault, IEDs may be configured to detect the fault and send an open or trip command to remove power from a faulted section of the power system. Furthermore, IEDs may be configured to detect the faulted phase (or phases) and a location of the fault to better aid in isolating the faulted phase and section, and to indicate to the power system operator where to dispatch repair crews.

In multi-phase electric power delivery systems, detecting a fault condition and calculating a location of a break in a conductor presents several challenges. For example, calculation of a fault location using impedance techniques improves with the duration of the fault condition. Accordingly, if the fault is cleared to early, the accuracy of the location calculation may be reduced. Detection of a broken conductor often requires a detection of an overcurrent condition, which typically does not occur before the conductor has contacted a grounding path to result in an overcurrent condition. In the time before ground is contacted, or if the grounding path is of sufficiently high impedance, detection of the broken conductor condition and determination of which phase is open by the open conductor has proven to be difficult.

In various conditions, a grounding path of a broken conductor may include materials that are of an incendiary nature in the presence of an electrical current as present on standard electric power delivery systems. In the past several years, fallen conductors have been accused of sparking wildfires. The results of a broken conductor contacting incendiary materials while still energized can be tragic. Previous fault detection techniques that use an elevated current signal from the conductor contacting ground are not satisfactory under these conditions.

What is needed are systems and methods to rapidly detect a broken conductor condition. Further, what is needed is a system for detecting a broken conductor condition before the conductor reaches ground. Further needed are systems and methods to determine the broken conductor and calculate a distance to the conductor break before an overcurrent condition is presented and fault occurs.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. In addition, data being tied or rendered together in a database record may be resident in the same memory device, or across several memory devices, and may be linked together in fields of a record in a database across a network. Embodiments may be provided as a computer program product including a non-transitory computer and/or machine-readable medium having stored thereon instructions that may be used to program a computer (or other electronic device) to perform processes described herein.

Figure 1:
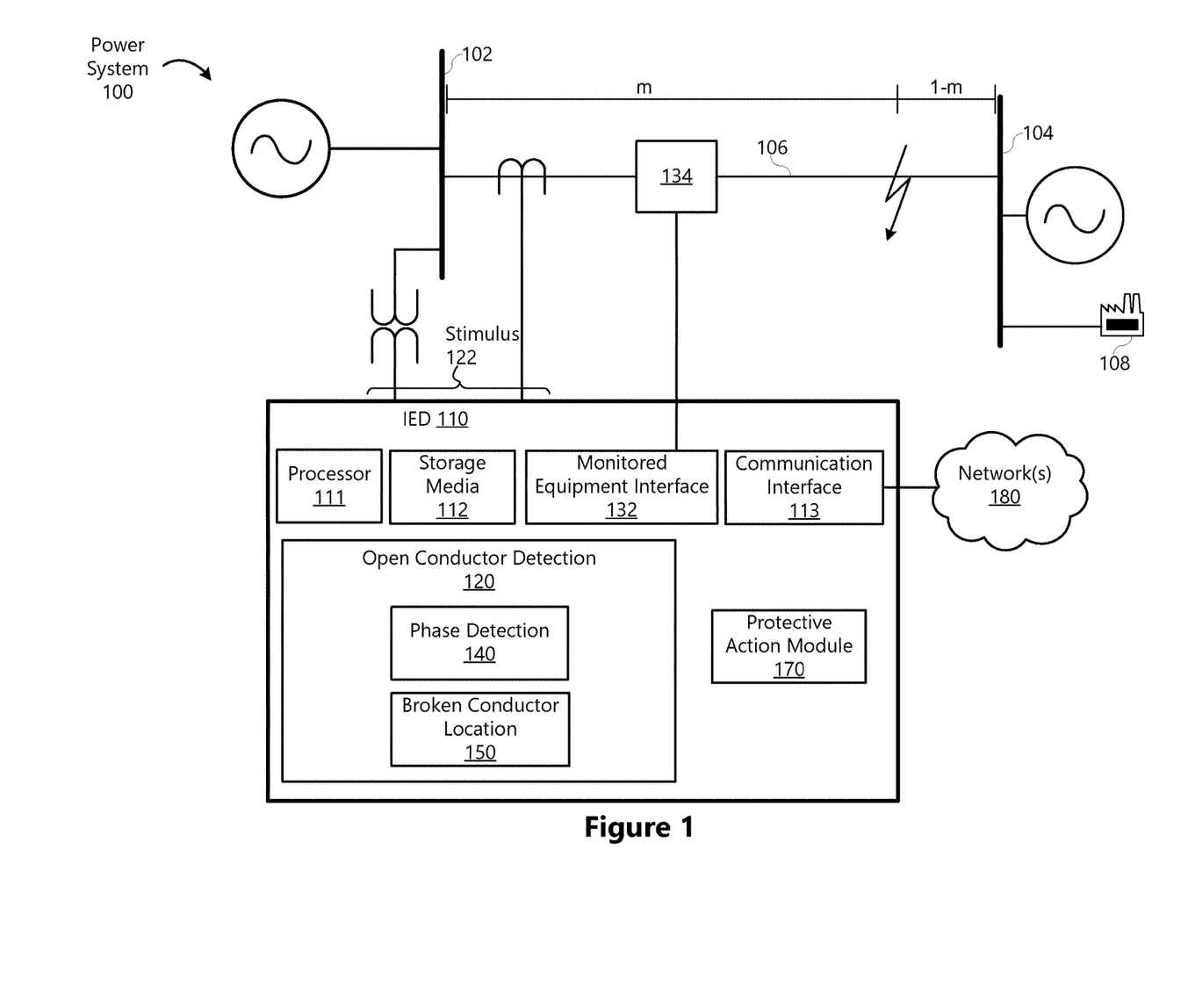
FIG. 1 illustrates a simplified one-line diagram of an electric power delivery system for providing electric power to loads including a system for detecting a broken conductor of the electric power delivery system.

FIG. 1 illustrates a simplified one-line diagram of an electric power delivery system 100. It should be noted that the system may include multiple phases and additional equipment and complexity. Also illustrated is an IED that may obtain electric power system information either directly or from merging units (MUs), and effect control actions on the electric power system to provide protection and automation to the electric power delivery system. The power system includes various equipment such as buses 102 and 104 electrically connected by one or more transmission lines 106. Various feeders may receive electric power from the second bus 104 via appropriate transformers and breakers for delivering electric power to distributed loads 108. Circuit breakers, such as circuit breaker 134 may be used to selectively connect and disconnect portions of the power system for various purposes such as reconfiguration, protection in the event of a fault, or the like. One or both of the buses 102, 104 may receive electric power from supplies such as generators, generation stations, transmission lines, and the like.

An IED 110 may be in communication with the electric power delivery system and configured to detect a broken conductor on one phase of the multiple-phase system, determine which phase is open, calculate a distance to a fault (or break in the conductor). IED 110 may obtain measurements from the electric power delivery system using a stimulus input 122. The stimulus input may be in communication with current transformers (CTs) to obtain current measurements, potential transformers (PTs) to obtain voltage measurements, or other such instrument transformers or similar devices to obtain measurements from the power system. Signals obtained may be filtered and sampled to produce digitized analog signals. In various embodiments, the stimulus input may be in communication with one or more merging units to obtain digitized analog signals from the electric power delivery system. Such digitized analog signals may be provided to a processor 111. The IED 110 may be in communication with a circuit breaker 122 (either directly or via a merging unit) via a monitored equipment interface 132 to obtain a status therefrom (open/closed) and to send commands (trip/close) to the circuit breaker 122.

The IED may include one or more computer-readable storage media 112, embodied in one or more units, which may be packaged together with, or separately from the processor 111. The storage media 112 may be a repository of computer-readable instructions that, when executed by the processor 111 cause the IED 110 to perform certain tasks. The instructions may include open conductor detection 120. The open conductor detection 120 may include instructions for phase detection 140, to determine which phase is open, and broken conductor location 150, which determines a distance to the break in the conductor.

IED 110 may include a protective action module 170 (which may be embodied as computer instructions on storage media 112) to determine whether to trip the circuit breaker, and to send an open/trip signal to the circuit breaker 122 via the monitored equipment interface 132.

IED may further include a communication interface 113 in communication with one or more devices or systems via network 180. The communication interface 113 may be used to transmit signals that include measurements, states, and commands that are made or determined by IED 110 to other systems and devices.

Figure 2:
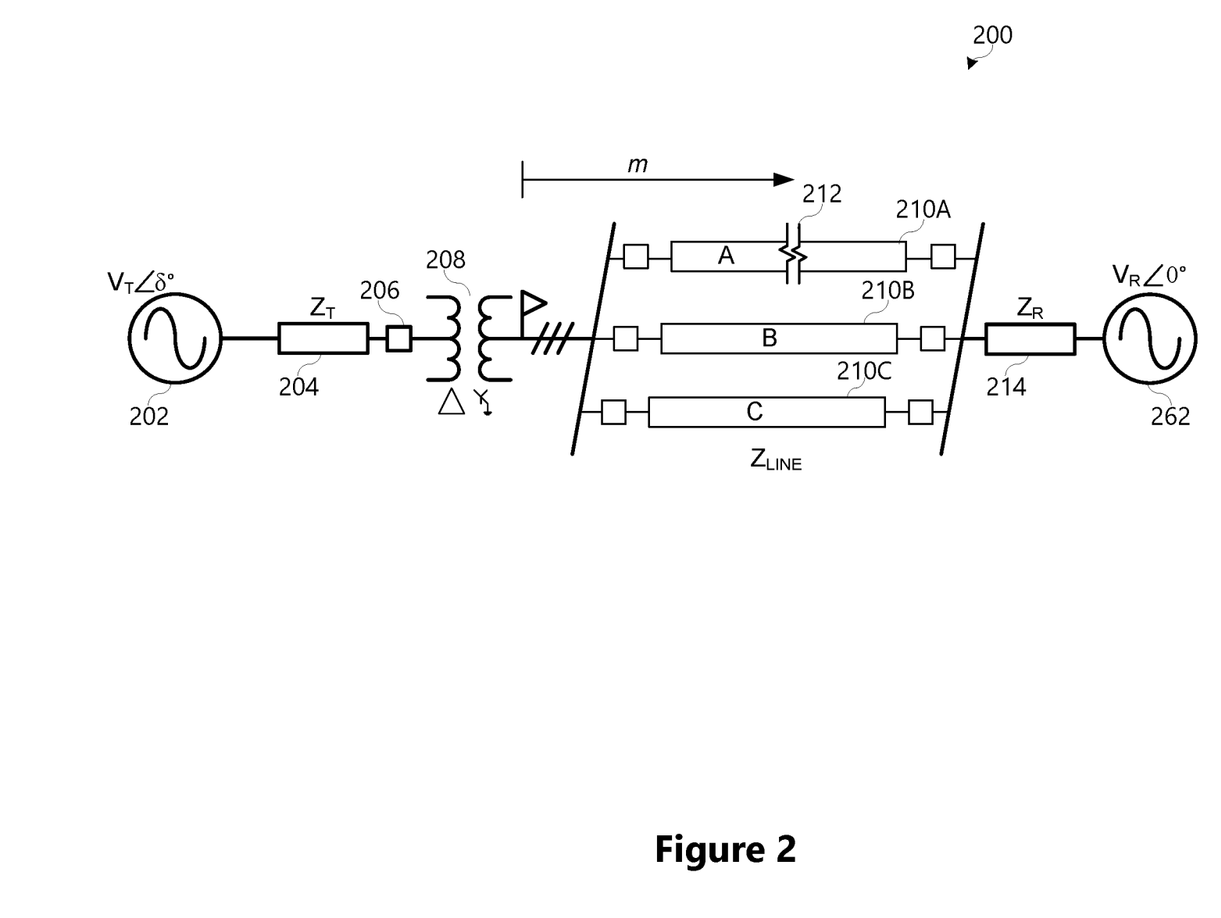
FIG. 2 illustrates a simplified impedance diagram of a three-phase electric power delivery system with a broken A-phase conductor at distance m from local relay.

FIG. 2 illustrates a simplified diagram of a power system 200 with three phases, A, B, C carried on three phase conductors 210A, 210B, 210C. The system is fed by sources 202 and 262. As illustrated, phase A is open at 212, which may be due to a broken conductor, with phases B and C closed (not faulted). Transmitting end may include a circuit breaker 206 for selectively opening the source end of the system. The circuit breaker 206 may include separate breaking functions for each phase to selectively open a single phase. A transformer 208 may be used to transform the current levels between source 202 and transmission lines 210A, 210B, 210C. Also shown are the various system impedances, including the transmitting-end source impedance $Z_T$ 204, line impedance $Z_{LINE}$, and receiving-end source impedance $Z_R$ 214. Transmitting-end source voltage $V_T$ at an angle $\delta°$ with receiving-end voltage $V_R$ (0°).

Figure 3:
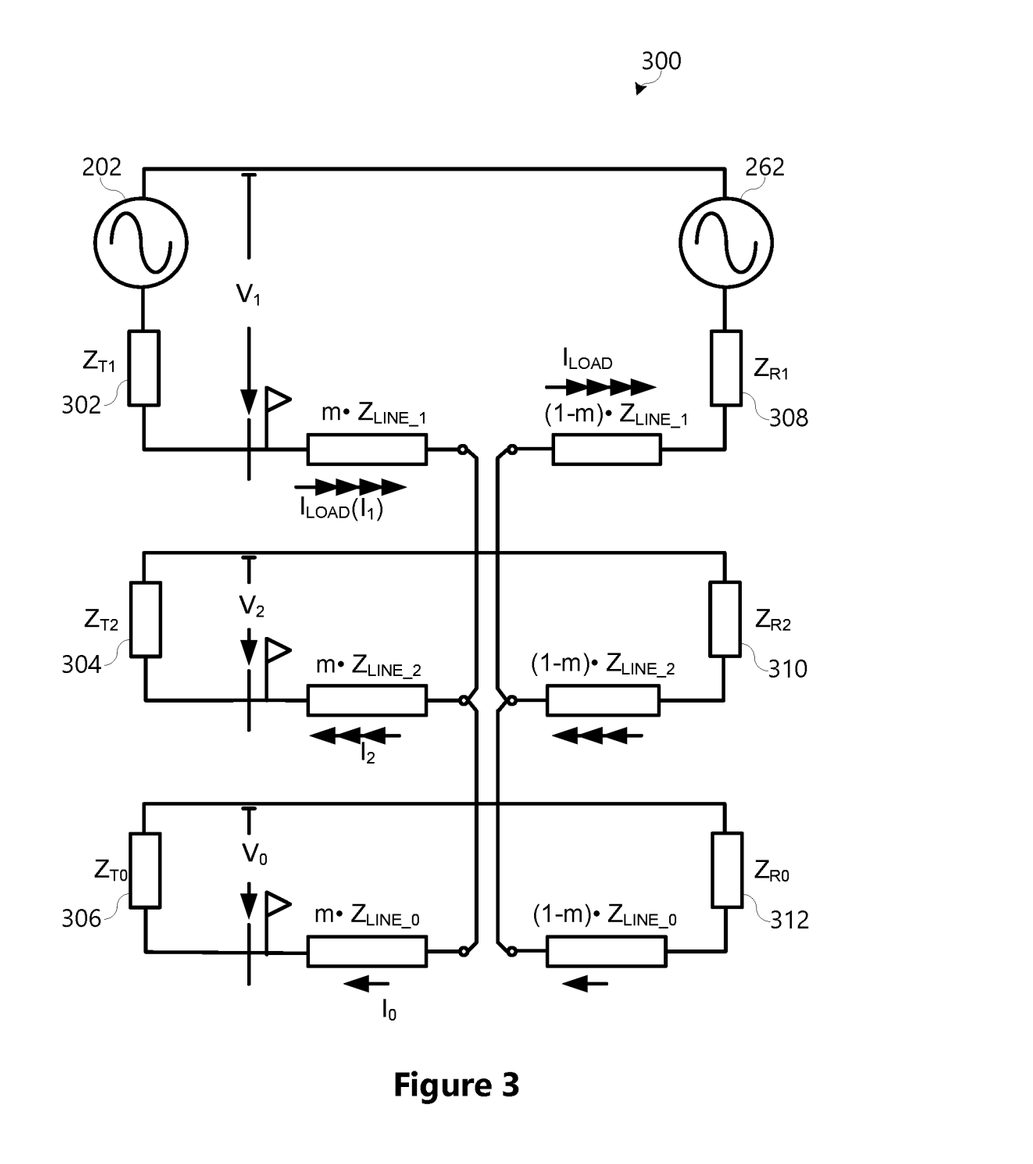
FIG. 3 illustrates a simplified sequence diagram during an open circuit condition with a broken A-phase conductor at a distance m from local relay.

FIG. 3 illustrates a sequence diagram of the system indicated in FIG. 2, showing the transmitting end positive-sequence impedance $Z_{T1}$ 302, negative-sequence impedance $Z_{T2}$ 304, and zero-sequence impedance $Z_{T0}$ 306; as well as the receiving-end positive-sequence impedance $Z_{R1}$ 308, negative-sequence impedance $Z_{R2}$ 310, and zero-sequence impedance $Z_{R0}$ 312. Note that for simplicity, the shunt reactances are not illustrated. The illustrated sequence diagram does not illustrate shunt capacitance of the transmission line. In this sequence diagram and all further sequence diagrams in this disclosure will use the A-phase as reference. Also illustrated are the positive-sequence voltage $V_1$, negative-sequence voltage $V_2$, and zero-sequence voltage $V_0$. The sequence diagram includes an opening in the A-phase conductor at a location m from the transmitting end T, where m may be expressed in terms of per-unit distance. The load current direction is shown $I_{LOAD}$. Further shown are the sequence line impedances including the positive-sequence line impedance $Z_{LINE\_1}$, negative-sequence line impedance $Z_{LINE\_2}$, and zero-sequence line impedance $Z_{LINE\_0}$. Finally, the sequence currents are shown as positive-sequence current $I_1$, negative-sequence current $I_2$, and zero-sequence current $I_0$. As illustrated in FIG. 2, the following observations may be made in Equations 1-4:

$$I_1 = -(I_2 + I_0) \qquad \text{Eq. 1}$$

Therefore:

$$\frac{|I_1|}{|I_0 + I_2|} = 1 \qquad \text{Eq. 2}$$

And:

$$|I_2| = |I_1| * \left( \frac{Z_{0_{Total}}}{Z_{0\_Total} + Z_{1\_Total}} \right) \qquad \text{Eq. 3}$$

Where:

$$Z_{1\_Total} = Z_{1\_Line} + Z_{T1} + Z_{R1} \qquad \text{Eq. 4A}$$

-continued $$Z_{0\_Total} = Z_{0\_Line} + Z_{T0} + Z_{R0} \qquad \text{Eq. 4B}$$

$$|I_0| = |I_1| * \left( \frac{Z_{1\_Total}}{Z_{0\_Total} + Z_{1\_Total}} \right) \qquad \text{Eq. 4C}$$

Examining Equations 3 and 4A-4C, it is observed that the local ($Z_T$) and remote ($Z_R$) source impedances are not available. However, the exact values of these impedances are not required. Instead, the ratio of the zero- and positive-sequence impedances of the sources should be approximately equal to the zero- and positive-sequence impedances of the line which is the case for most power systems, as shown in Equation 5:

$$\frac{|Z_{0\_Sources}|}{|Z_{1\_Sources}|} \approx \frac{|Z_{0\_Line}|}{|Z_{1\_Line}|} \qquad \text{Eq. 5}$$

Typically, for a transmission line, the relationship between zero-sequence line impedance ($Z_{0\_Line}$) and positive-sequence line impedance ($Z_{1\_Line}$) generally follows: $Z_{0\_Line} \approx 3*Z_{1\_Line}$. It follows, therefore, if a transmission line experiences a pole open/broken conductor condition, the negative-sequence current ($I_2$) magnitude is approximately 75% of the positive-sequence current ($I_1$) magnitude and the zero-sequence current ($I_0$) magnitude will be approximately 25% of $I_1$ magnitude.

Accordingly, two conditions can be used to determine a broken conductor or pole open condition in a power system (such as on a transmission line distribution line) as shown in Equations 6, 7A and 7B:

$$|I_1| \approx |I_0| + |I_2| \qquad \text{Eq. 6}$$

$$|I_2| \approx \left| \frac{Z_{0_{Line}}}{Z_{0_{Line}} + Z_{1_{Line}}} \right| * |I_1| \qquad \text{Eq. 7A}$$

$$|I_0| \approx \left| \frac{Z_{1_{Line}}}{Z_{0_{Line}} + Z_{1_{Line}}} \right| * |I_1| \qquad \text{Eq. 7B}$$

If any of the above two conditions (Equation 6 and Equations 7A-7B) are true, then a broken conductor or pole open condition may be determined. The first condition is the magnitude of the positive-sequence current is equal to a sum of the magnitudes of the zero- and negative-sequence currents (Equation 6). The second condition includes both: a ratio of the magnitudes of the negative-sequence current and the positive-sequence currents is in the range of a magnitude of the ratio of the zero-sequence line impedance to a sum of the zero- and positive-sequence line impedances (Equation 7A); and a ratio of the magnitudes of the zero-sequence current and the positive sequence current is in the range of a magnitude of the ratio of the positive-sequence line impedance to a sum of the zero- and positive-sequence line impedance (Equation 7B). Although the above Equations and description recite "equal to" and "in the range of," the embodiments herein allow for tolerances in the satisfaction of the equations. Predetermined tolerances for each of the Equations 6, 7A, and 7B may be used for determination of an open-pole or broken conductor condition.

To detect which of the phases is open, the angle difference between $I_1$, $I_2$, and $I_0$ can be employed. Using the A-phase current as a reference, the following observations may be made for a system with an "ABC" phase rotation in Equations 8-10:

A-Phase Open:

$$ANG(I_1)-ANG(I_2)=180°$$

$$ANG(I_1)-ANG(I_0)=180° \qquad \text{Eq. 8}$$

B-Phase Open:

$$ANG(I_1)-ANG(I_2)=60°$$

$$ANG(I_1)-ANG(I_0)=-60° \qquad \text{Eq. 9}$$

C-Phase Open:

$$ANG(I_1)-ANG(I_2)=-60°$$

$$ANG(I_1)-ANG(I_0)=60° \qquad \text{Eq. 10}$$

Figure 4:
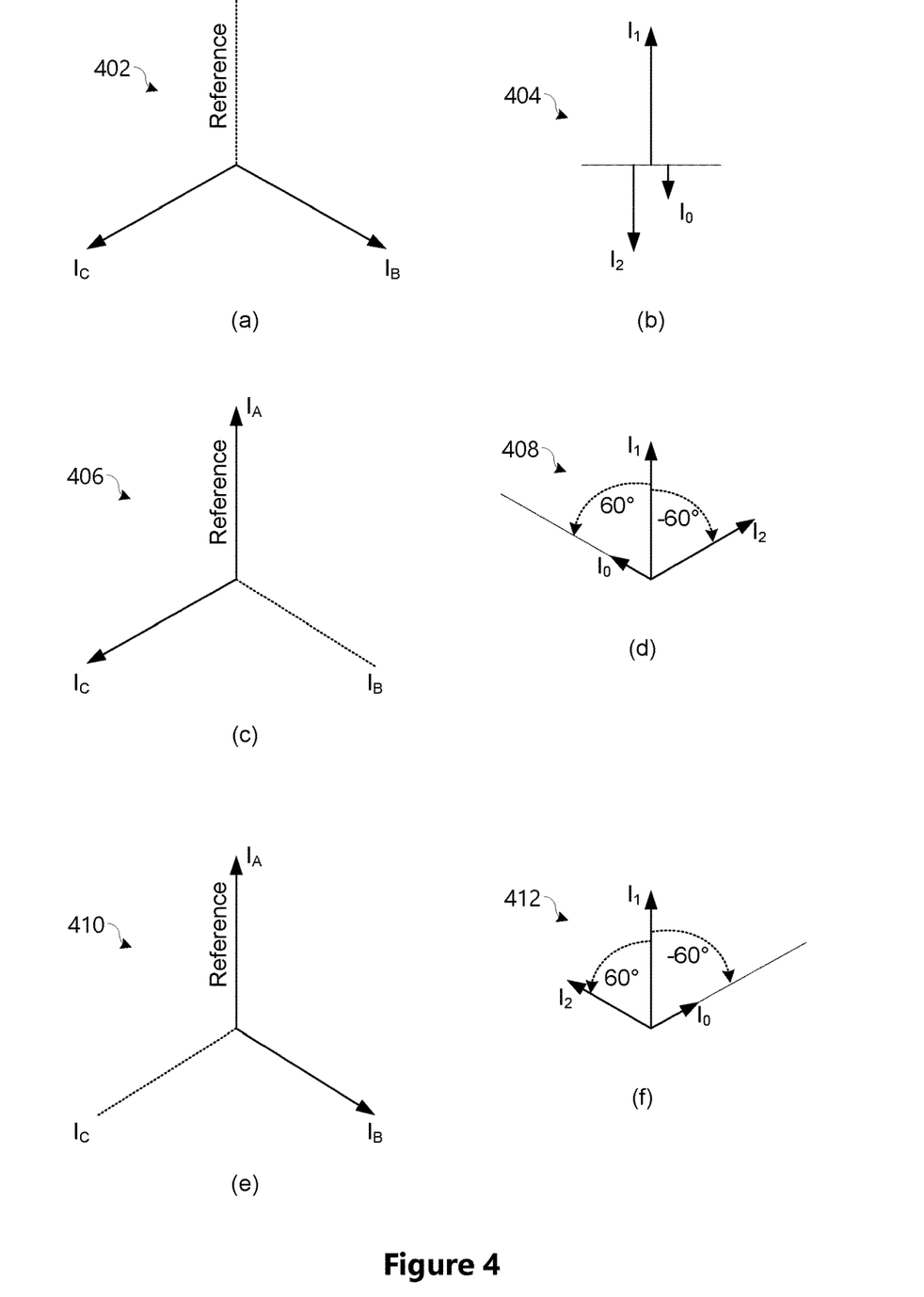
FIG. 4 illustrates relationships between sequence currents for a broken conductor condition of different phases.

FIG. 4 illustrates the relationship between the sequence currents for a broken conductor condition for the different phases in a power system with ABC phase rotation, with the A-phase current as a reference. 402 illustrates an A-phase open condition (the reference phase is also the open phase). Under an A-phase open condition, 404 illustrates that the angle difference between $I_1$ and $I_2$ is 180°, and the angle difference between $I_1$ and $I_0$ is also 180°. Similarly, 406 illustrates relative phase magnitudes under a B-phase open condition with reference to the A-phase. 406 illustrates the angle difference between $I_1$ and $I_2$ as 60°, where the angle difference between $I_1$ and $I_0$ is −60°. Finally, 410 illustrates an open C-phase with reference to the A-phase. The angle differences illustrated in 412 show that the difference between $I_1$ and $I_2$ is −60°, and the angle difference between $I_1$ and $I_0$ is 60°.

To detect which phase is open for a system with ACB phase rotation, the relationship between the sequence currents and the broken conductor is as follows in Equations 11-13:

A-Phase Open:

$$ANG(I_1)-ANG(I_2)=180°$$

$$ANG(I_1)-ANG(I_0)=180° \qquad \text{Eq. 11}$$

B-Phase Open:

$$ANG(I_1)-ANG(I_2)=-60°$$

$$ANG(I_1)-ANG(I_0)=60° \qquad \text{Eq. 12}$$

C-Phase Open:

$$ANG(I_1)-ANG(I_2)=60°$$

$$ANG(I_1)-ANG(I_0)=-60° \qquad \text{Eq. 13}$$

The total instantaneous charging current for a transmission line is given by Equation 14:

$$\begin{bmatrix} i_{A\_CHRG} \\ i_{B\_CHRG} \\ i_{C\_CHRG} \end{bmatrix} = \begin{pmatrix} C_S & C_M & C_M \\ C_M & C_S & C_M \\ C_M & C_M & C_S \end{pmatrix} \cdot \begin{bmatrix} \frac{dv_A}{dt} \\ \frac{dv_B}{dt} \\ \frac{dv_C}{dt} \end{bmatrix} \qquad \text{Eq. 14}$$

However, it is not required that the instantaneous charging current be known. Instead, it is more important that the steady state root-mean squared (RMS) fundamental charging current magnitude and phase be known. Accordingly, Equation 14 may be amended to Equation 15A:

$$\begin{bmatrix} I_{A\_CHRG} \\ I_{B\_CHRG} \\ I_{C\_CHRG} \end{bmatrix} = j \begin{pmatrix} B_S & B_M & B_M \\ B_M & B_S & B_M \\ B_M & B_M & B_S \end{pmatrix} \cdot \begin{bmatrix} V_A \\ V_B \\ V_C \end{bmatrix} \quad \text{Eq. 15A}$$

where:

$$B_S = \frac{2B_1 + B_0}{3} \quad \text{Eq. 15B}$$

$$B_M = \frac{B_0 - B_1}{3} \quad \text{Eq. 15C}$$

$V_A$, $V_B$, and $V_C$ are the fundamental voltage phasors.

It should be noted that Equations 15A-C will give the steady state RMS fundamental charging current for the entire line. If the measured line current is less than the total calculated line charging current we have an open or broken phase conductor. For multiterminal transmission lines we can calculate the minimum charging current by dividing the total line charging current by the number of line terminals.

In various embodiments, the systems and methods herein may determine a distance to a broken conductor when sufficient current is available for measurement. Once it has been established that there is an open or broken phase conductor and the involved phase has been identified, then the distance to the open or broken conductor break point may be calculated. Taking the ratio between the actual charging current supplied by the involved broken conductor $I_{CHARGE\_ACT}$ and the total line charging current $I_{A\_CHRG}$ calculated by Equation 15 and multiplying it by the line length to calculate the distance to the conductor break, as shown in Equation 16.

$$\text{Distance to Conductor Break} = \frac{I_{CHARGE\_ACT}}{I_{A\_CHRG}} * \text{Line\_Length} \quad \text{Eq. 16}$$

Figure 5:
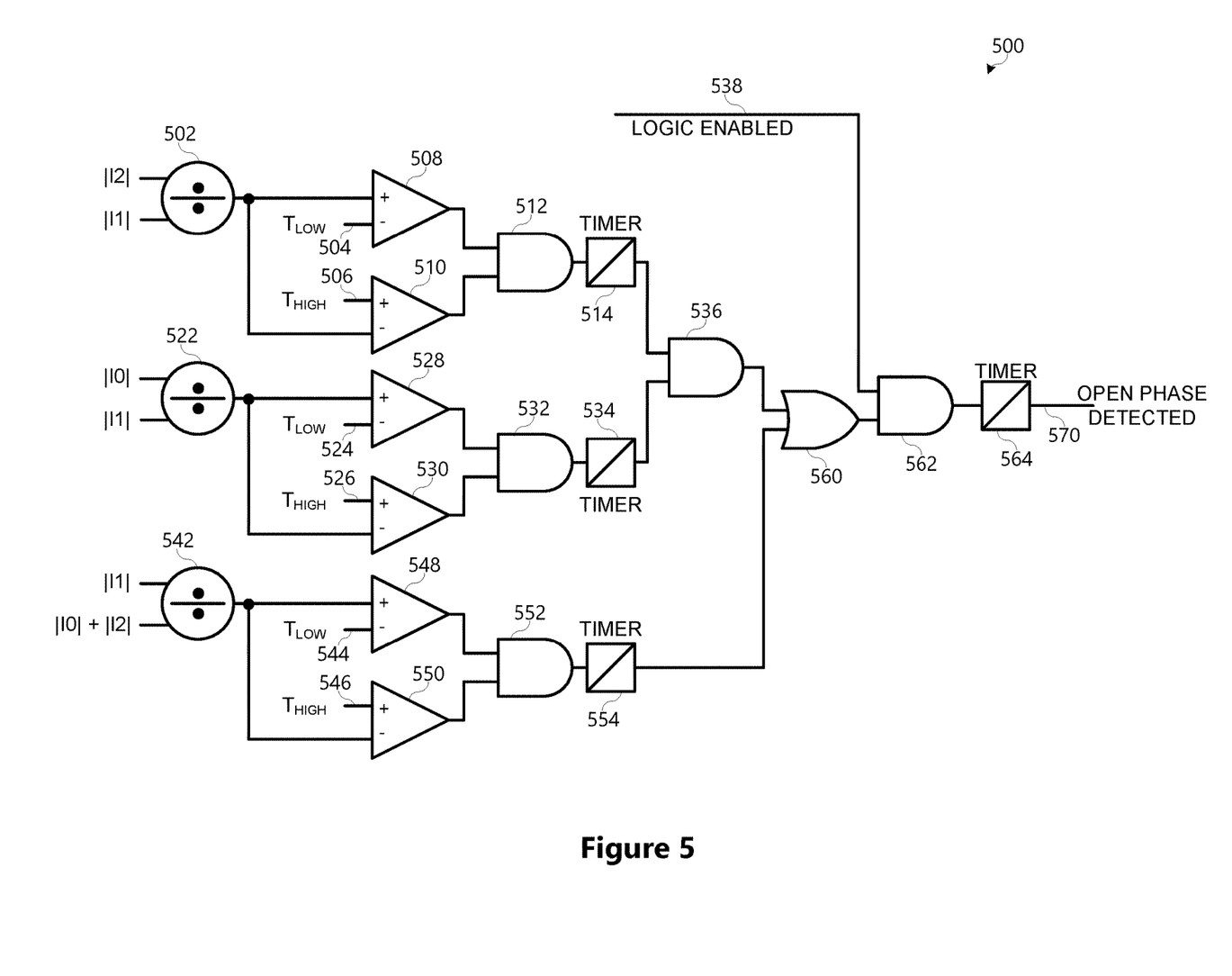
FIG. 5 illustrates a logic diagram useful for detecting a broken conductor in accordance with several embodiments herein.

FIG. 5 illustrates a simplified logic diagram for detecting a broken conductor for a single-conductor-per-phase line, using comparisons between magnitudes of the sequence currents $I_1$, $I_2$, and $I_0$. Broadly, the simplified logic diagram may be used to detect a broken conductor condition using implement the conditions described in Equations 6 and 7A-7B. That is, the logic may be used to determine a broken conductor condition when either Equation 6A or both Equations 7A and 7B are satisfied. A "LOGIC ENABLED" bit 538 may be used to enable the broken conductor detection logic by asserting to AND gate 562. If the LOGIC ENABLED bit 538 is not present, then the broken conductor detection cannot be made. The LOGIC ENABLED bit 538 may be deasserted in several predetermined conditions that would interfere with the determination of a broken conductor such as, for example, when the magnitudes of any phase currents were insufficient for reliable determination of sequence currents (magnitudes and/or angles); when a disturbance has been detected; when a CT saturation condition is detected; and the like.

OR gate 560 receives stimulus from an upper branch related to determining whether Equations 7A and 7B are satisfied and a lower branch related to determining whether Equation 6 is satisfied. That is, if either (OR gate 560) the condition of Equation 6 or both of the conditions of Equations 7A and 7B persist and 562 the LOGIC ENABLED bit is asserted for the time of the timer 564 for a predetermined time, then the OPEN PHASE DETECTED bit 570 is asserted, indicating that one phase of the multiple phases is open. To determine whether Equation 6 is satisfied, a ratio of the magnitude of the positive-sequence current and a sum of the zero- and negative-sequence currents is calculated 542. The ratio from 542 is compared 548 to a low threshold 544 and compared 550 with a high threshold 546. If the ratio from 542 exceeds the low threshold 544 and does not exceed the high threshold 546, then the comparators 548 and 550 assert to AND gate 552. AND gate 552 then asserts to timer 554 which in turn asserts to OR gate 560 when the AND gate 552 asserts for the predetermined time of timer 554. As can be recalled from Equation 6, the magnitude of the positive-sequence current should be around equal to the sum of the magnitudes of the zero- and negative-sequence current during a broken conductor or open-phase condition. Thus, the ratio of the positive-sequence current to the sum of the magnitudes of the zero- and negative-sequence currents should be around one to indicate a broken conductor or open-phase condition. Accordingly, the low threshold could be a setting of less than unity, and the high threshold 546 may be a setting of greater than unity. In various embodiments, the lower threshold may be set to a lower limit of $1-B_{SET}$ and an upper threshold 546 may be set to an upper limit of $1+B_{SET}$. In various embodiments, $B_{SET}$ may be a boundary setting margin. In one particular embodiment, $B_{SET}$ is 0.1 such that the ratio must fall between 0.9 and 1.1 for both comparators 548, 550 to assert.

The condition of Equation 7A is implemented by determining a ratio of the magnitudes of negative-sequence current to positive-sequence current 502. The ratio is compared to a low threshold 504 in comparator 508 and a high threshold 506 in comparator 510. The thresholds 504 and 506 may be determined using a ratio of impedances illustrated in Equation 7A. In particular, the low threshold 504 may be calculated as the magnitude of the ratio of impedances from Equation 7A less a predetermined setting, and the high threshold 506 may be calculated as the magnitude of the ratio of impedances of Equation 7A plus a predetermined setting. When the ratio 502 is within the low and high thresholds 504, 506, then comparators 508 and 510 assert to AND gate 512, which asserts to timer 514. If the condition persists such that AND gate 512 asserts for the predetermined time 514, then timer asserts to AND gate 536.

The condition of Equation 7B is implemented by determining a ratio of the magnitudes of zero-sequence current to positive-sequence current 522. The ratio is compared to a low threshold 524 in comparator 528 and a high threshold 526 in comparator 530. The thresholds 524 and 526 may be determined using a ratio of impedances illustrated in Equation 7B. In particular, the low threshold 524 may be calculated as the magnitude of the ratio of impedances from Equation 7B less a predetermined setting, and the high threshold 526 may be calculated as the magnitude of the ratio of impedances of Equation 7B plus a predetermined setting. When the ratio 522 is within the low and high thresholds 524, 526, then comparators 528 and 530 assert to AND gate 532, which asserts to timer 534. If the condition persists such that AND gate 532 asserts for the predetermined time 534, then timer asserts to AND gate 536.

When both timers 514 and 534 assert to AND gate 536 (indicating that the conditions of Equations 7A and 7B are present), then AND gate 536 asserts to OR gate 560. When OR gate 560 receives assertion from either the AND gate 536 or time 554, then the broken conductor condition is detected (assuming LOGIC ENABLED bit 538 is asserted) resulting in assertion of OR gate 560 and AND gate 562. If such condition persists for the time of timer 564, then the OPEN PHASE DETECTED bit is asserted 570. Accordingly, an open conductor may be detected using sequence currents in an electric power delivery system.

Returning to the embodiments as described above, the sequence-current magnitudes may be used in accordance with Equations 6, 7A, and 7B and the embodiment illustrated in FIG. 5 to determine whether an open phase or broken conductor condition is present. Once the detection has been made, it may be beneficial to determine which phase is open. Angles may be used in accordance with Equations 8-13 to determine which phase is open. To that end, FIGS. 6-13 illustrate examples of logic that may be implemented to determine which phase is open by comparing angles of sequence currents for ABC and ACB rotation.

Figure 6:
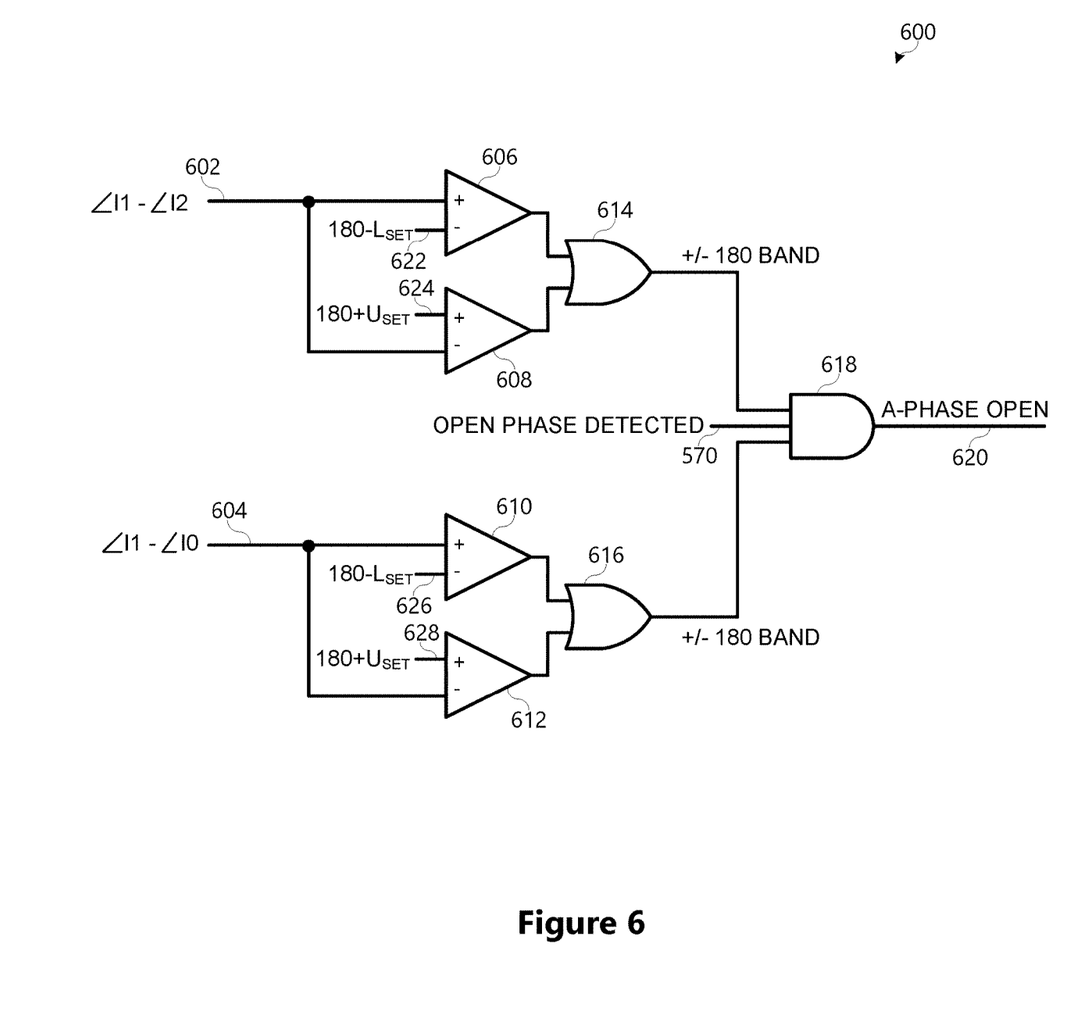
FIG. 6 illustrates a logic diagram for determining an A-phase open using a comparison of angles with specific sectors, for a power system with an ABC phase rotation.
Figure 7:
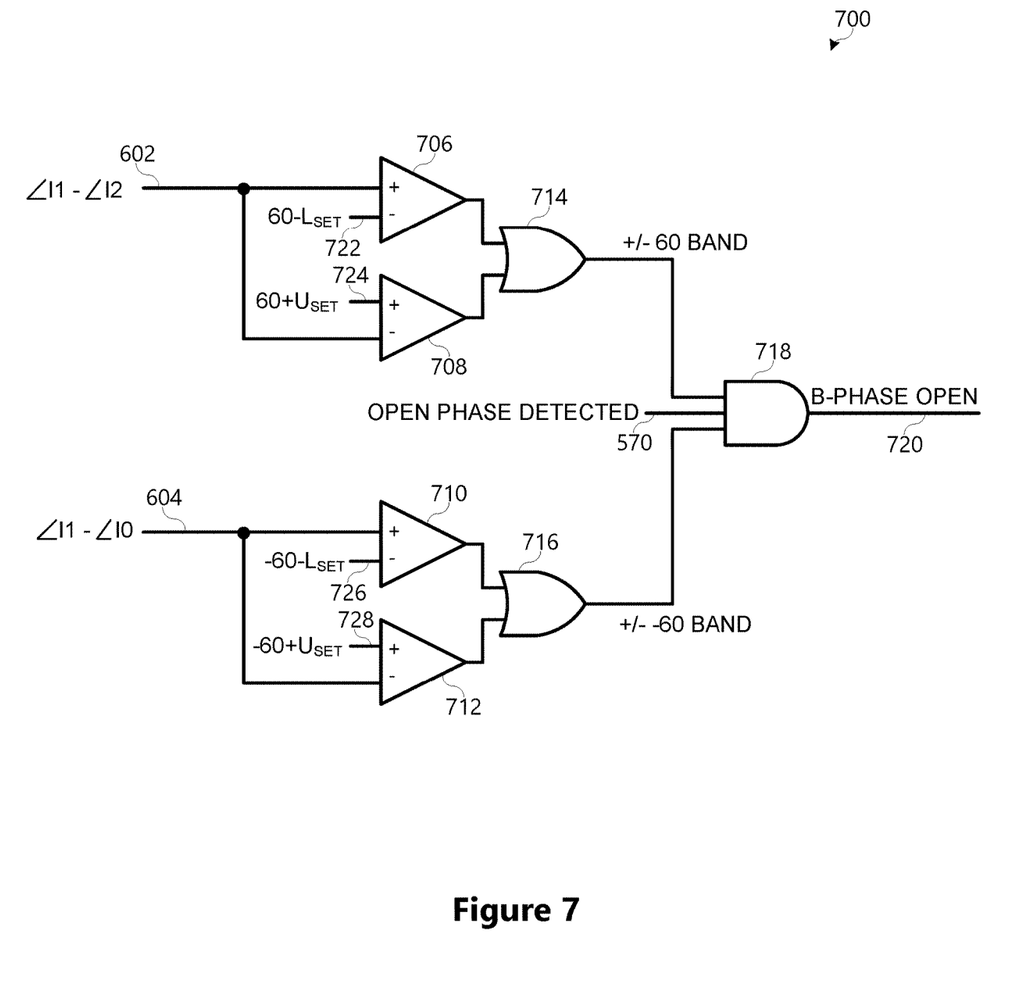
FIG. 7 illustrates a logic diagram for determining a B-phase open using a comparison of angles with specific sectors, for a power system with an ABC phase rotation.
Figure 8:
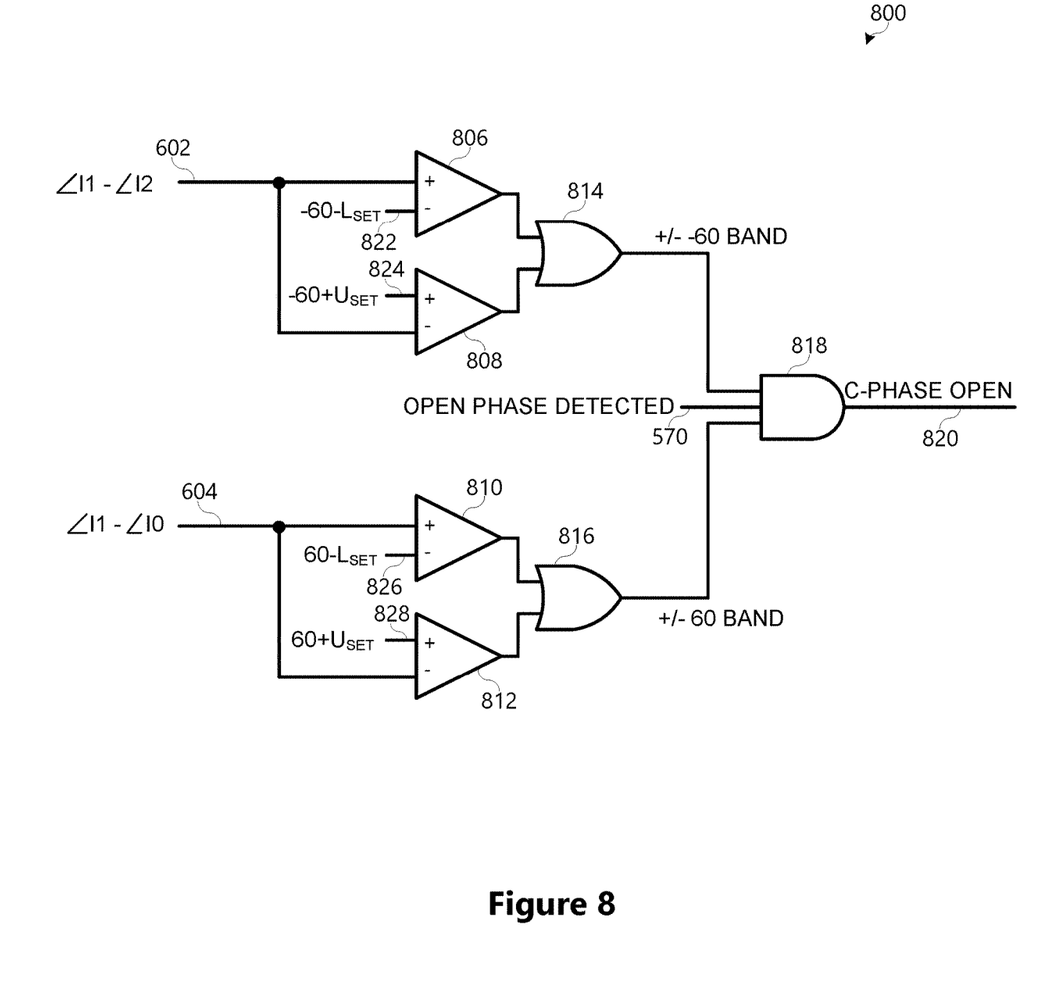
FIG. 8 illustrates a logic diagram for determining a C-phase open using a comparison of angles with specific sectors, for a power system with an ABC phase rotation.

FIGS. 6-8 illustrate simplified logic diagrams for determining which phase has the open conductor when the power system is implemented with an ABC phase rotation. In particular, as described in Equation 8, FIG. 6 illustrates simplified logic for comparing a difference between the positive- and negative-sequence current angles 602 with a low threshold 622 in comparator 606 and a high threshold 624 in 608. The comparators 606, 608 assert to OR gate 614 such that when the angle difference is between the thresholds 622, 624, the comparators 606 and 608 assert ultimately to AND gate 618. Similarly, the difference between the positive- and zero-sequence current angles 604 is compared against a low threshold 626 and a high threshold 628 in comparators 610 and 612. Comparators 610 and 612 assert to OR gate 616 such that when the angle difference is within the range of the thresholds 626, 628, then an assertion is made to AND gate 618. If the angle differences 602, 604 are within the prescribed ranges, and the open phase detected bit 570 is asserted (see, e.g. FIG. 5), then AND gate asserts the A-Phase Open bit 620 indicating that the open A-phase or broken A-phase conductor has been detected.

It should be noted that the high thresholds 622 and 626 and the low thresholds 624, 628 may be predetermined thresholds around 180° to determine an A-phase fault in an ABC rotation with reference to the A-phase. The thresholds may be determined as $180°+U_{SET}$ using upper setting $U_{SET}$; and, $180°-L_{SET}$ using a lower setting $L_{SET}$. The upper and lower settings may be predetermined settings. The upper and lower settings may be the same or different. The upper and lower settings may be common for each phase element or different for each phase.

Similarly, as described in Equation 9 to determine a B-phase open condition, FIG. 7 illustrates simplified logic for comparing a difference between the positive- and negative-sequence current angles 602 with a low threshold 722 in comparator 706 and a high threshold 724 in 708. The comparators 706, 708 assert to OR gate 714 such that when the angle difference is between the thresholds 722, 724, the comparators 706 and 708 assert ultimately to AND gate 718. Similarly, the difference between the positive- and zero-sequence current angles 604 is compared against a low threshold 726 and a high threshold 728 in comparators 710 and 712. Comparators 710 and 712 assert to OR gate 716 such that when the angle difference is within the range of the thresholds 726, 728, then an assertion is made to AND gate 718. If the angle differences 602, 604 are within the prescribed ranges, and the open phase detected bit 570 is asserted (see, e.g. FIG. 5), then AND gate asserts the B-Phase Open bit 720 indicating that the open B-phase or broken B-phase conductor has been detected.

It should be noted that the high thresholds 722 and 726 and the low thresholds 724, 728 may be predetermined thresholds around 60° and −60° to determine a B-phase fault in an ABC rotation with reference to the A-phase. The thresholds may be determined as $+/-60°+U_{SET}$ using upper setting $U_{SET}$; and, $+/-60°-L_{SET}$ using a lower setting $L_{SET}$. The upper and lower settings may be predetermined settings. The upper and lower settings may be the same or different. The upper and lower settings may be common for each phase element or different for each phase.

Similarly, as described in Equation 10 to determine a C-phase open condition, FIG. 8 illustrates simplified logic for comparing a difference between the positive- and negative-sequence current angles 602 with a low threshold 822 in comparator 806 and a high threshold 824 in 808. The comparators 806, 808 assert to OR gate 814 such that when the angle difference is between the thresholds 822, 824, the comparators 806 and 808 assert ultimately to AND gate 818. Similarly, the difference between the positive- and zero-sequence current angles 604 is compared against a low threshold 826 and a high threshold 828 in comparators 810 and 812. Comparators 810 and 812 assert to OR gate 816 such that when the angle difference is within the range of the thresholds 826, 828, then an assertion is made to AND gate 818. If the angle differences 602, 604 are within the prescribed ranges, and the open phase detected bit 570 is asserted (see, e.g. FIG. 5), then AND gate asserts the C-Phase Open bit 820 indicating that the open C-phase or broken C-phase conductor has been detected.

It should be noted that the high thresholds 822 and 826 and the low thresholds 824, 828 may be predetermined thresholds around −60° and +60° to determine a C-phase fault in an ABC rotation with reference to the A-phase. The thresholds may be determined as $-/+60°+U_{SET}$ using upper setting $U_{SET}$; and, $-/+60°-L_{SET}$ using a lower setting $L_{SET}$. The upper and lower settings may be predetermined settings. The upper and lower settings may be the same or different. The upper and lower settings may be common for each phase element or different for each phase.

It should be noted that for ACB phase rotation, similar logic may be used in accordance with Equations 11-13 to determine the open phase under those conditions.

Figure 9:
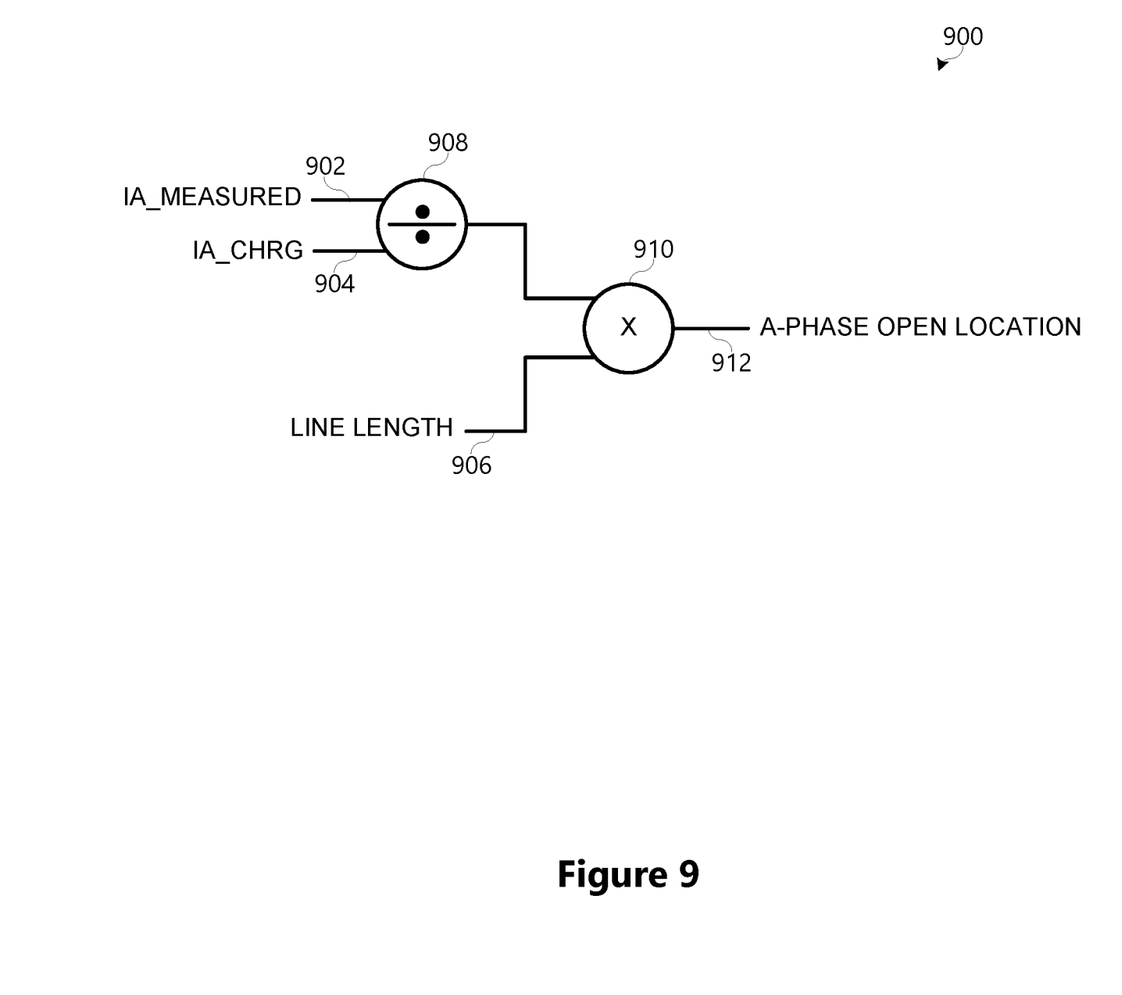
FIG. 9 illustrates a logic diagram for determining a location of an A-phase open conductor.

As has been described above, once an open phase or broken conductor has been detected, the open phase may be determined. Now, once the open phase has been determined, a distance to the break or fault may be determined using, for example, the technique described in association with Equation 16. FIG. 9 illustrates a simplified logic diagram 900 for calculating a distance to an opening in the phase conductor for a detected A-phase open condition. In particular, a ratio between the measured actual charging current 902 supplied by the involved broken conductor (A-phase is illustrated) IA_MEASURED and the total line charging current 904 IA_CHRG is determined 908 and multiplied in 910 by the line length 906. The product 912 is a distance to the break in the A-phase conductor, as described in Equation 16. Similar logic may be applied for a distance to a break on the B phase or the C phase when one of those phases are the determined broken conductor.

While specific embodiments and applications of the disclosure have been illustrated and described, it is to be understood that the disclosure is not limited to the precise configurations and components disclosed herein. It should also be noted that although the above description may reference "open phase" "open conductor" "broken conductor" and the like, these terms may be interchangeable unless otherwise specifically indicated. For avoidance of doubt, the term "open conductor" includes the concepts of "open phase" and "broken conductor" unless the context of the use of the terms indicates otherwise. Accordingly, many changes may be made to the details of the above-described embodiments without departing from the underlying principles of this disclosure. The scope of the present invention should, therefore, be determined only by the following claims.

The invention claimed is:

1. A system for detecting an open conductor in a multiple-phase electric power delivery system, comprising:
    an intelligent electronic device (IED) receiving current signals from each of the multiple phases of the electric power delivery system; the IED including:
        a power system signal input for receiving electric power delivery system signals including the current signals from each phase of the multiple phases;
        an open conductor element to:
            calculate positive-sequence currents from the current signals;
            calculate zero-sequence currents from the current signals;
            calculate negative-sequence currents from the current signals;
            determine an open conductor condition using the positive-sequence current, zero-sequence current, and negative-sequence current; and,
        a phase detection element to:
            calculate a first angle difference between the positive-sequence current and the negative-sequence current;
            calculate a second angle difference between the positive-sequence current and the zero-sequence current; and,
            determine the phase that includes the open conductor using the first angle difference and the second angle difference; and,
        a protective action module to effect a protective action upon determination of the open conductor condition and the determination of the phase that includes the open conductor.

2. The system of claim 1, wherein the open conductor element determines the open conductor condition when a magnitude of the positive-sequence current is within a range of a sum of magnitudes of the zero-sequence current and negative-sequence current.

3. The system of claim 1, wherein the open conductor element determines the open conductor condition when a ratio of a magnitude of the positive-sequence current to a sum of magnitudes of the zero-sequence current and negative-sequence current is within a predetermined range.

4. The system of claim 1, wherein the open conductor element determines the open conductor condition when a ratio of a magnitude of the negative-sequence current to a magnitude of the positive-sequence current is within a predetermined range.

5. The system of claim 1, wherein the open conductor element determines the open conductor condition when a ratio of a magnitude of the zero-sequence current to a magnitude of the positive-sequence current is within a predetermined range.

6. The system of claim 1, wherein the open conductor element determines the open conductor condition when both:
    a ratio of a magnitude of the negative-sequence current to a magnitude of the positive-sequence current is within a predetermined range; and,
    a ratio of a magnitude of the zero-sequence current to a magnitude of the positive-sequence current is within a predetermined range.

7. The system of claim 1, wherein the phase detection element determines the phase of the open conductor by comparing the first angle difference to a first threshold and the second angle to a second threshold.

8. The system of claim 1, further comprising a broken conductor location element to determine a location of an opening of the phase of the open conductor.

9. The system of claim 8 wherein the broken conductor location element determines the location by comparing a charging current supplied by the phase of the open conductor and total line charging current.

10. The system of claim 9, wherein the location comprises a per-unit length when the comparison is multiplied by a line length.

11. A method for detecting an open conductor in a multiple-phase electric power delivery system, comprising:
    receiving, by an intelligent electronic device (IED), electric power delivery system signals including current signals from each phase of the multiple phases of the electric power delivery system;
    calculating positive-sequence currents from the current signals;
    calculating zero-sequence currents from the current signals;
    calculating negative-sequence currents from the current signals;
    determining an open conductor condition using the positive-sequence current, zero-sequence current, and negative-sequence current;
    calculating a first angle difference between the positive-sequence current and the negative-sequence current;
    calculating a second angle difference between the positive-sequence current and the zero-sequence current;
    determining the phase that includes the open conductor using the first angle difference and the second angle difference;
    effecting a protective action upon determination of the open conductor condition and the determination of the phase that includes the open conductor.

12. The method of claim 11, wherein the open conductor condition is determined when a magnitude of the positive-sequence current is within a range of a sum of magnitudes of the zero-sequence current and negative-sequence current.

13. The method of claim 11, wherein the open conductor condition is determined when a ratio of a magnitude of the positive-sequence current to a sum of magnitudes of the zero-sequence current and negative-sequence current is within a predetermined range.

14. The method of claim 11, wherein the open conductor condition is determined when a ratio of a magnitude of the negative-sequence current to a magnitude of the positive-sequence current is within a predetermined range.

15. The method of claim 11, wherein the open conductor condition is determined when a ratio of a magnitude of the zero-sequence current to a magnitude of the positive-sequence current is within a predetermined range.

16. The method of claim 11, wherein the open conductor condition is determined when both:
    a ratio of a magnitude of the negative-sequence current to a magnitude of the positive-sequence current is within a predetermined range; and,
    a ratio of a magnitude of the zero-sequence current to a magnitude of the positive-sequence current is within a predetermined range.

17. The method of claim 11, wherein the phase of the open conductor is determined by comparing the first angle difference to a first threshold and the second angle to a second threshold.

18. The method of claim 11, further comprising determining a location of an opening of the phase of the open conductor.

19. The method of claim 18 wherein the location is determined by comparing a charging current supplied by the phase of the open conductor and total line charging current.

20. The method of claim 19, wherein the location comprises a per-unit length when the comparison is multiplied by a line length.

\* \* \* \* \*